United States Patent
Leobandung et al.

(10) Patent No.: US 8,492,228 B1
(45) Date of Patent: Jul. 23, 2013

(54) FIELD EFFECT TRANSISTOR DEVICES HAVING THICK GATE DIELECTRIC LAYERS AND THIN GATE DIELECTRIC LAYERS

(75) Inventors: Effendi Leobandung, Stormville, NY (US); Junli Wang, Singerlands, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 13/547,647

(22) Filed: Jul. 12, 2012

(51) Int. Cl.
*H01L 21/8234* (2006.01)

(52) U.S. Cl.
USPC ........... 438/275; 438/199; 438/197; 438/151; 438/193; 438/299; 438/300; 257/392; 257/308; 257/347; 257/401; 257/E21.409; 257/E27.111

(58) Field of Classification Search
USPC ............... 438/151, 193, 197, 300, 299, 199, 438/275; 257/308, 347, 401, E21.409, E21.703, 257/E27.111, 392
See application file for complete search history.

(56) References Cited

U.S. PATENT DOCUMENTS

| | | | |
|---|---|---|---|
| 6,380,020 B1 | 4/2002 | Shimizu | |
| 6,642,105 B2 | 11/2003 | Kim et al. | |
| 7,074,662 B2 * | 7/2006 | Lee et al. | 438/199 |
| 7,091,566 B2 | 8/2006 | Zhu et al. | |
| 7,169,670 B2 | 1/2007 | Lee et al. | |
| 7,585,746 B2 | 9/2009 | Jung et al. | |
| 7,700,993 B2 | 4/2010 | Cai et al. | |
| 7,736,965 B2 * | 6/2010 | Cheng et al. | 438/197 |
| 7,859,024 B2 | 12/2010 | Bosshart | |
| 7,939,412 B2 * | 5/2011 | Orlowski et al. | 438/284 |
| 7,994,603 B2 | 8/2011 | Wang et al. | |
| 8,269,283 B2 * | 9/2012 | Cea et al. | 257/368 |
| 8,362,568 B2 * | 1/2013 | Lin et al. | 257/368 |
| 2008/0197424 A1 * | 8/2008 | Haensch et al. | 257/407 |
| 2009/0014812 A1 | 1/2009 | Wang et al. | |
| 2010/0118610 A1 | 5/2010 | Katsumata et al. | |
| 2011/0068401 A1 * | 3/2011 | Izumida et al. | 257/347 |
| 2011/0079829 A1 | 4/2011 | Lai et al. | |
| 2011/0095378 A1 * | 4/2011 | Lee et al. | 257/401 |
| 2011/0195557 A1 * | 8/2011 | Teo et al. | 438/384 |
| 2011/0266622 A1 * | 11/2011 | Luning et al. | 257/347 |
| 2013/0049134 A1 * | 2/2013 | Sunamura | 257/392 |

* cited by examiner

*Primary Examiner* — Bac Au
*Assistant Examiner* — Victor Barzykin
(74) *Attorney, Agent, or Firm* — Cantor Colburn LLP; Vazken Alexanian

(57) ABSTRACT

A method includes forming a first gate stack over a portion of a fin, forming a dummy gate stack over the fin, growing an epitaxial material from exposed portions of the fin, forming a layer of dielectric material over the epitaxial material, the first gate stack, and the dummy gate stack, performing a planarizing process that removes portions of the layer of dielectric material, the first gate stack, and the dummy gate stack, pattering a first mask over portions of the layer of dielectric material and the dummy gate stack, forming a silicide material on exposed portions of the first gate stack, removing the first mask, pattering a second mask over portions of the layer of dielectric material and the first gate stack, removing a polysilicon portion of the dummy gate stack to define a cavity, removing the second mask, and forming a second gate stack in the cavity.

20 Claims, 26 Drawing Sheets

FIELD EFFECT TRANSISTOR DEVICES HAVING THICK GATE DIELECTRIC LAYERS AND THIN GATE DIELECTRIC LAYERS

FIELD OF INVENTION

The present invention relates generally to field effect transistor (FET) devices, and more specifically, to FinFET and Tri-gate FETs.

DESCRIPTION OF RELATED ART

Field effect transistor (FET) devices, such as, for example, FinFETs and Tri-gate FETS, include fins disposed on a substrate and gate stacks arranged conformally over the fins. In FinFET devices, the fins are often capped with a capping material such that the gate stacks contacts opposing sides of the fins. Tri-gate FETs may not include the capping material such that the gate stacks contact the opposing sides and top surface of the fins.

BRIEF SUMMARY

According to one embodiment of the present invention, a method for fabricating a semiconductor device includes forming a fin on a substrate, forming a first gate stack over a first portion of the fin, forming a dummy gate stack over a second portion of the fin, growing an epitaxial material from exposed portions of the fin to define source and drain regions, forming a silicide material on exposed portions of the epitaxial material, forming a layer of dielectric material over the silicide material, the first gate stack, and the dummy gate stack, performing a planarizing process that removes portions of the layer of dielectric material, the first gate stack, and the dummy gate stack, pattering a first mask over portions of the layer of dielectric material and the first gate stack, removing a polysilicon portion of the dummy gate stack to define a cavity, removing the first mask, forming a second gate stack in the cavity, forming a second mask over portions of the layer of dielectric material and the second gate stack, and forming a silicide material on exposed portions of the first gate stack.

According to another embodiment of the present invention, a method for fabricating a semiconductor device includes forming a fin on a substrate, forming a first gate stack over a portion of the fin, forming a dummy gate stack over a portion of the fin, growing an epitaxial material from exposed portions of the fin to define source and drain regions, forming a silicide material on exposed portions of the epitaxial material, forming a layer of dielectric material over the silicide material, the first gate stack, and the dummy gate stack, performing a planarizing process that removes portions of the layer of dielectric material, the first gate stack, and the dummy gate stack, pattering a first mask over portions of the layer of dielectric material and the dummy gate stack, forming a silicide material on exposed portions of the first gate stack, removing the first mask, pattering a second mask over portions of the layer of dielectric material and the first gate stack, removing a polysilicon portion of the dummy gate stack to define a cavity, removing the second mask, and forming a second gate stack in the cavity.

According to yet another embodiment of the present invention, a method for fabricating a semiconductor device includes forming a fin on a substrate, forming a first gate stack over a portion of the fin, forming a dummy gate stack over a portion of the fin, growing an epitaxial material from exposed portions of the fin to define source and drain regions, forming a layer of dielectric material over the epitaxial material, the first gate stack, and the dummy gate stack, performing a planarizing process that removes portions of the layer of dielectric material, the first gate stack, and the dummy gate stack, pattering a first mask over portions of the layer of dielectric material and the dummy gate stack, forming a silicide material on exposed portions of the first gate stack, removing the first mask, pattering a second mask over portions of the layer of dielectric material and the first gate stack, removing a polysilicon portion of the dummy gate stack to define a cavity, removing the second mask, and forming a second gate stack in the cavity.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 17 illustrates the resultant structure following the procedures described above in FIGS. 1-13;

FIG. 18 illustrates the removal of the masking layer and the dummy gate structures;

FIG. 19 illustrates the formation of nFET and pFET gate stacks; and

FIG. 20 illustrates the resultant structure following a planarization process.

FIG. 21 illustrates the resultant structure following the procedures described above in FIGS. 1-4 and 6;

FIG. 22 illustrates the resultant structure following processes similar to the processes described above in FIGS. 7-11;

FIG. 23 illustrates the formation of a masking layer followed by the formation of a silicide material;

FIG. 24 illustrates the formation of capping layers;

FIG. 25 illustrates the formation of cavities;

FIG. 26 illustrates the formation of conductive contacts; and

FIG. 27 illustrates the resultant structure following the formation of conductive contacts.

DETAILED DESCRIPTION

In integrated circuits, it is desirable to fabricate FET devices that operate at low voltages (e.g., for processing tasks) and FET devices that operate at high voltages (e.g., for input/output tasks) on a common wafer. In this regard, the FET devices that operate at low voltages include relatively thin gate-dielectric layers while the FET devices that operate at relatively high voltages include relatively thick gate-dielectric layers. The exemplary embodiments described below offer methods and resultant structures that include FET devices having thick gate-dielectric layers and FET devices having thin gate-dielectric layers arranged on a common substrate. The FET devices may include FinFET and/or Tri-gate FET devices.

Figure 1:
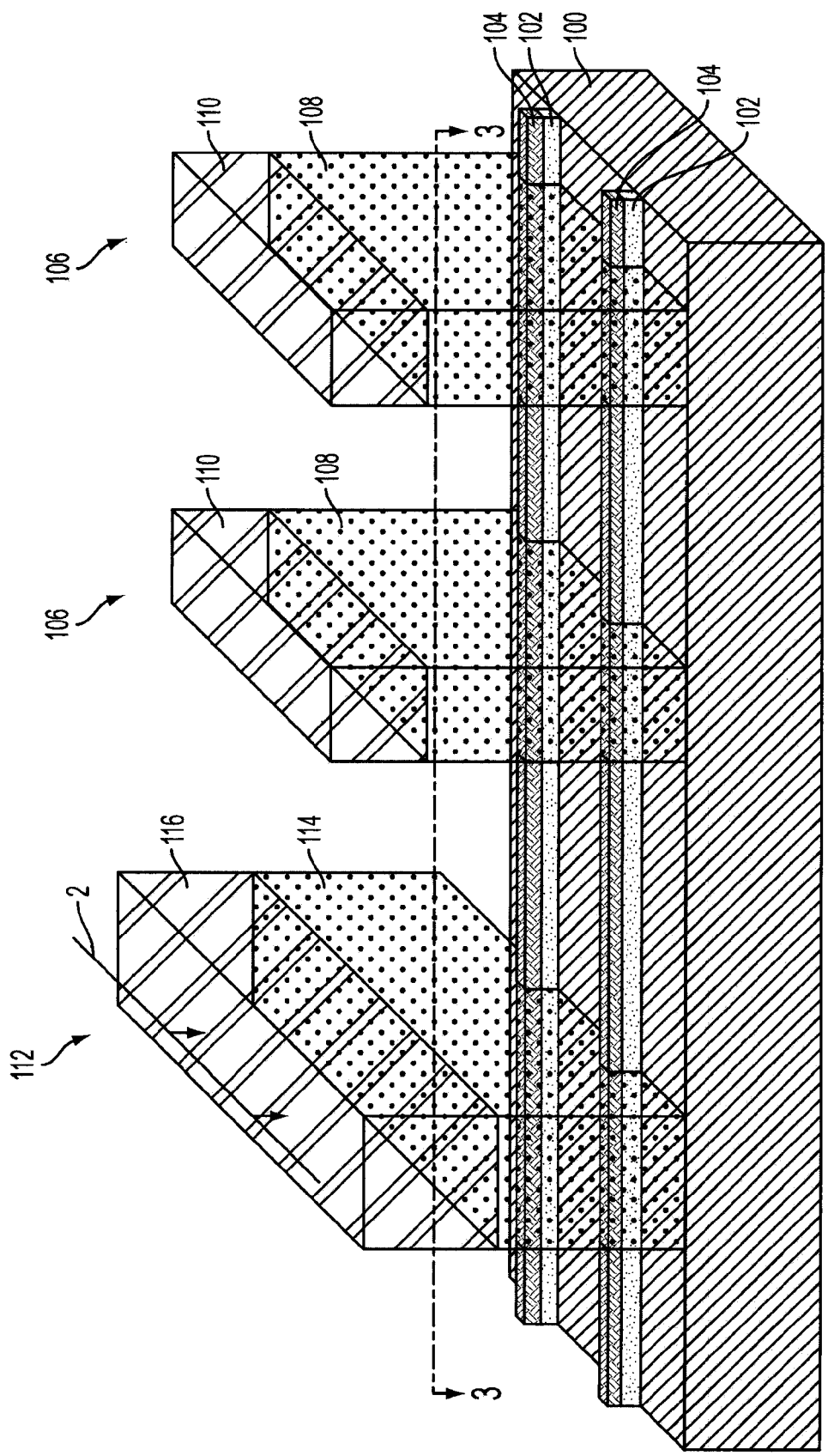
FIG. 1 illustrates a perspective view of an exemplary arrangement that is used in the fabrication of FET devices.

FIG. 1 illustrates a perspective view of an exemplary arrangement that is used in the fabrication of FET devices. The arrangement will include a thick gate-dielectric devices and thin gate-dielectric devices arranged on a common substrate 100. In the illustrated embodiment the devices may include both nFET devices and pFET devices. Those skilled in the art will understand that the methods and resultant structures described herein may include any arrangement or number of nFET or pFET devices. The illustrated embodiment includes a substrate 100 that may include, for example, a silicon on insulator (SOI) substrate that includes a buried oxide (BOX) layer. Alternatively, the substrate 100 may include a bulk silicon material substrate. Fins 102 are arranged on the substrate 100. The fins 102 may include a silicon material such as, for example Si or SiGe. The fins 102 are capped with a capping layer 104 that may include, for example, SiO2. Dummy gate structures 106 are arranged on the substrate 100 and conformally over the fins 102. The dummy gate structures 106 include a polysilicon layer 108 and a hardmask layer 110 that may include, for example, an oxide or nitride material. In the illustrated embodiment, the dummy gate structures 106 will be removed (as described below) to form metallic gates of thin gate-dielectric devices. The structure 112 includes a polysilicon structure 114 and a hardmask layer 116.

The arrangement of FIG. 1 may be fabricated using any suitable fabrication methods including, for example, lithographic patterning and etching processes to form the fins 102. Following the formation of the fins 102, the structures 106 and 112 may be formed by, for example, a material deposition and lithographic patterning and etching processes.

Figure 2:
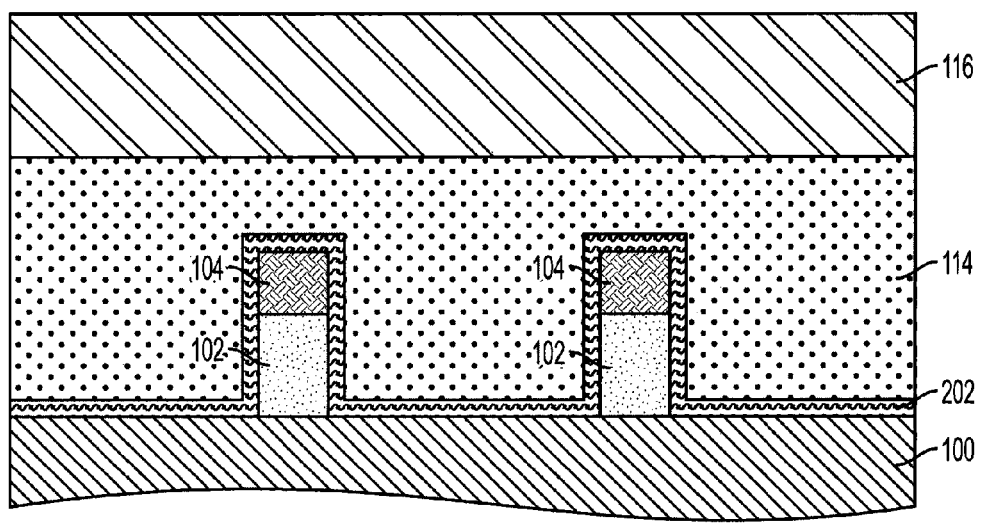
FIG. 2 illustrates a side cut-away view along the line 2 of FIG. 1.
Figure 3:
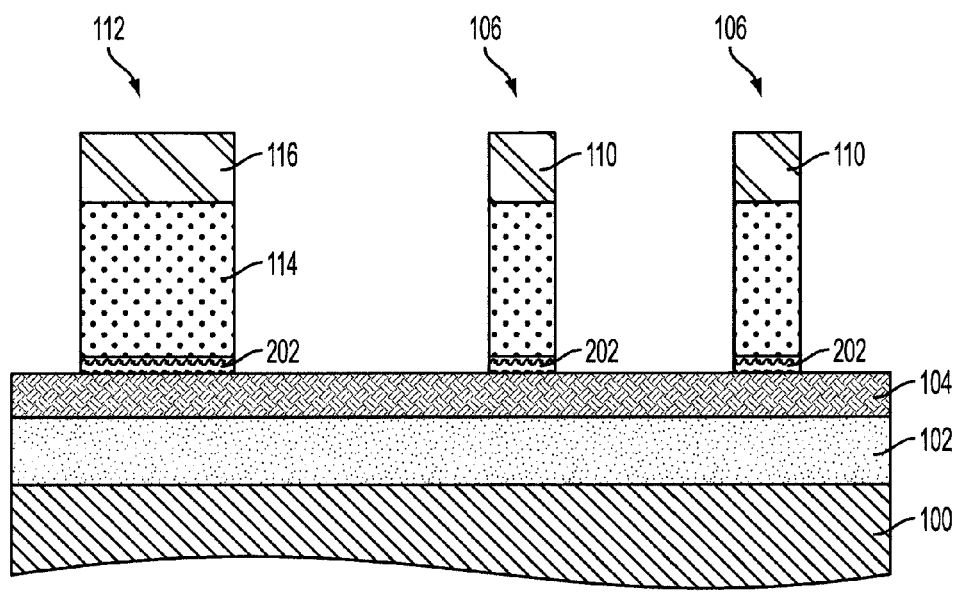
FIG. 3 illustrates a side cut-away view along the line 3 of FIG. 1.

FIG. 2 illustrates a side cut-away view along the line 2 (of FIG. 1), and FIG. 3 illustrates a side cut-away view along the line 3 (of FIG. 1). The illustrated embodiment includes a layer of oxide material 202 (not shown for illustrative purposes in FIG. 1) that is formed over portions of the substrate 100, the fins 102 and the capping layers 104.

The capping layer 104 is shown for illustrative purposes and may be included in the fabrication of FinFET devices. Alternatively, the capping layer 104 may be removed. In this regard, the methods and resultant structures described below would include Tri-gate FET devices.

Figure 4:
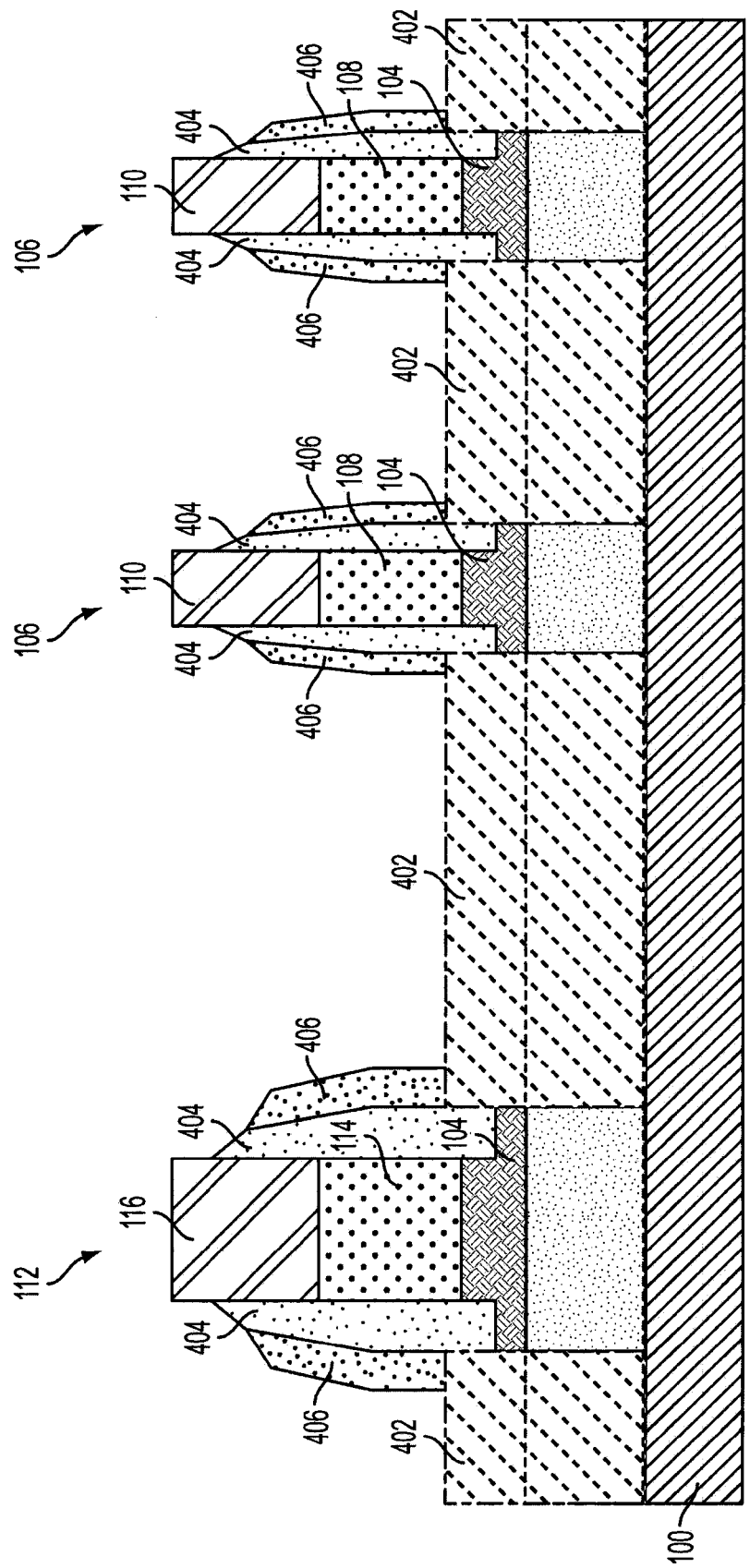
FIG. 4 illustrates a side cut-away view along the line 3 of FIG. 1.

FIG. 4 illustrates a side cut-away view (along the line 3 of FIG. 1) of the resultant structure following the formation of source and drain regions 402. The regions 402 are formed by forming a first set of spacers 404 adjacent to the dummy gate structures 106 and the structure 112. The first set of spacers 404 may include, for example, an oxide or nitride material, and may be formed by, for example, a material deposition process followed by an etching process. Following the formation of the first set of spacers 404 the regions 402 are formed by, for example, an epitaxial growth process that grows an epitaxial material such as, for example, Si or SiGe from the exposed portions of the fins 102. The epitaxial material may be doped in-situ with dopants during the epitaxial process. Following the formation of the regions 402 a second set of spacers 406 may be formed using similar methods and/or materials as discussed above regarding the first spacers 404. The regions 402 may be implanted with ions following the growth process if desired.

Figure 5:
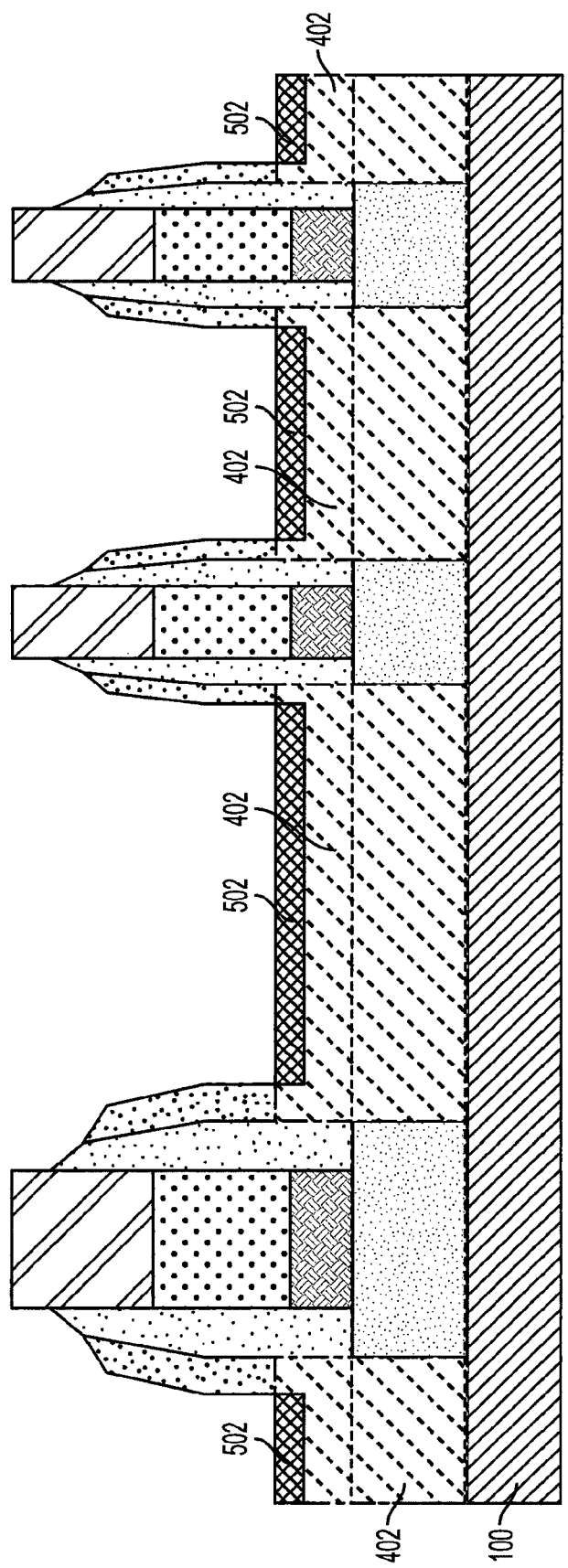
FIG. 5 illustrates the formation of a silicide material.

FIG. 5 illustrates the formation of a silicide material 502 in exposed portions of the regions 402. The silicide material 502 may include, for example, a thin transition metal layer such as, for example, titanium, cobalt, nickel, platinum, or tungsten. The wafer is heated, allowing the transition metal to react with exposed silicon in the active regions of the semiconductor device (e.g., source, drain, gate) forming a low-resistance transition metal silicide. The transition metal does not react with the insulating material present on the wafer. Following the reaction, any remaining transition metal is removed by selective chemical etching, leaving silicide contacts in only the active regions of the device.

Figure 6:
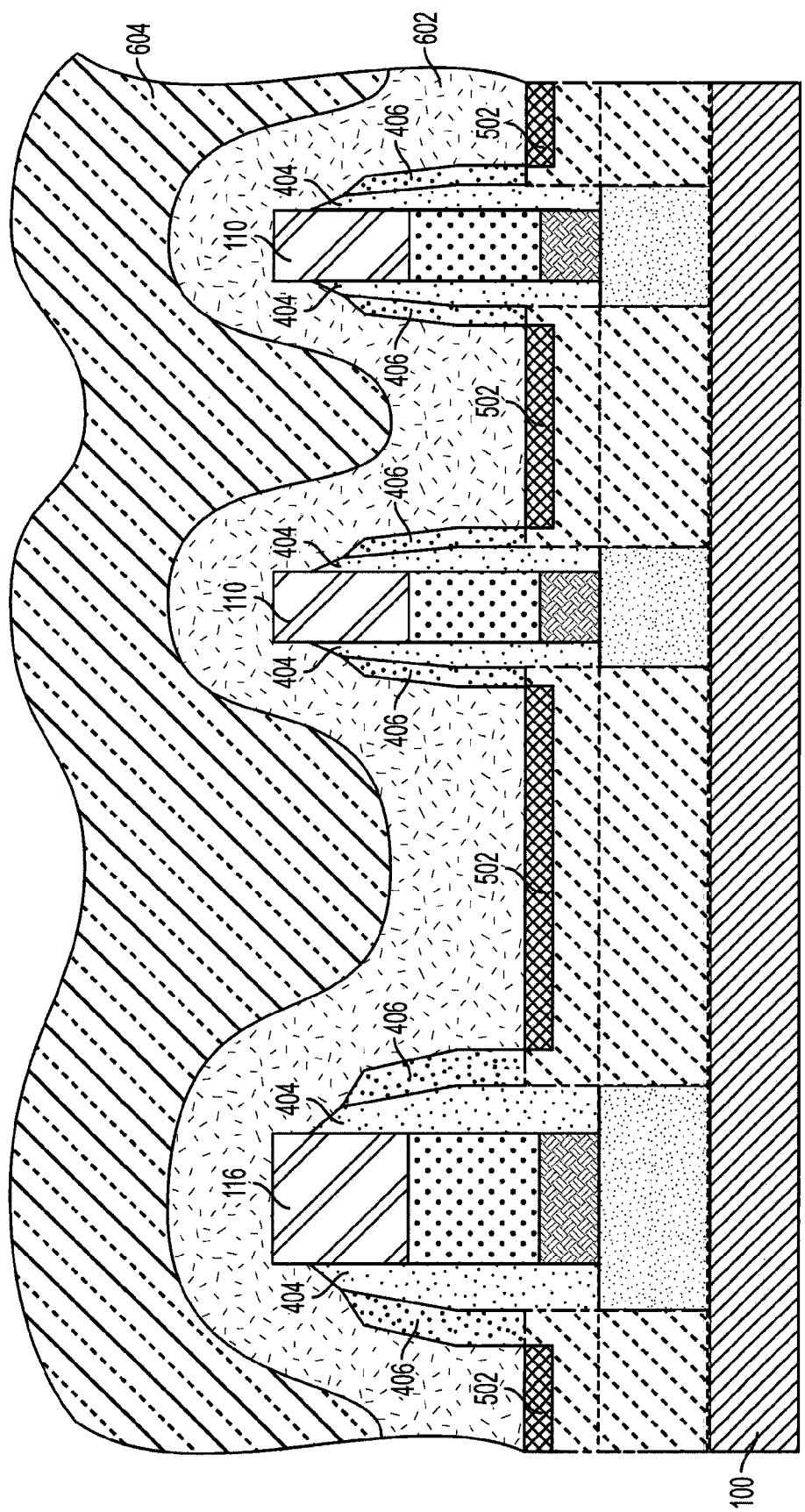
FIG. 6. illustrates the formation of a dielectric material layer.

FIG. 6 illustrates the formation of a first dielectric material layer 602 over exposed portions of the silicide material 502, the spacers 404 and 406, the hardmask layers 110 and 116, and the substrate 100. Following the formation of the first dielectric material layer 602, a second dielectric material layer 604 may be formed over the first dielectric material layer 602. The first and second dielectric material layers 602 and 604 may include, for example, a nitride or an oxide material that is formed by, for example, low temperature chemical vapor deposition processes.

Figure 7:
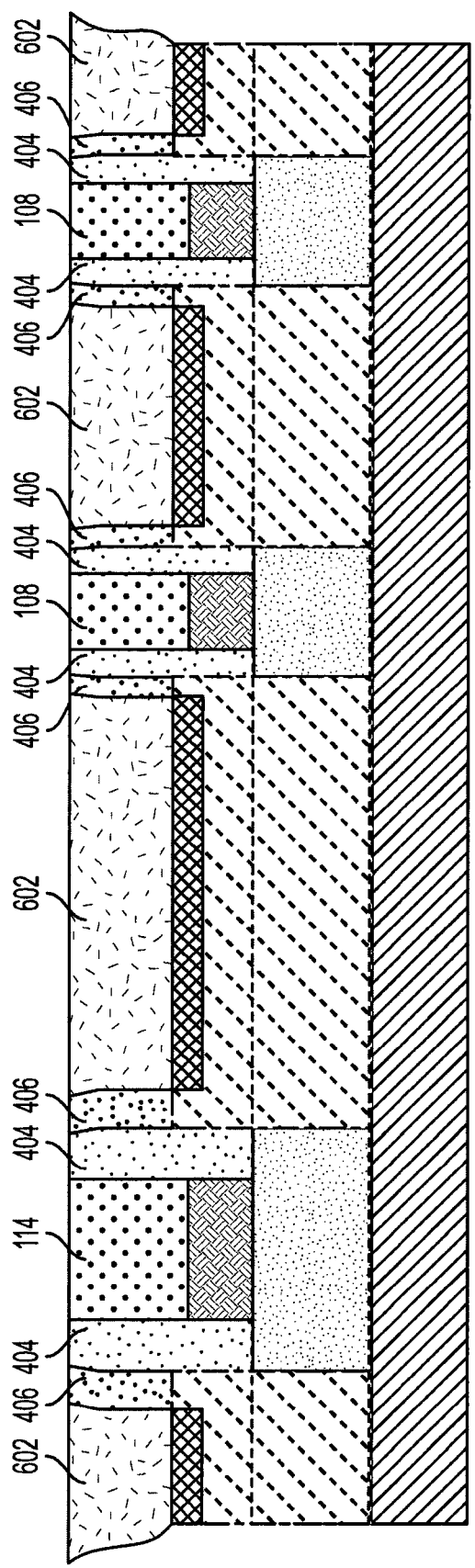
FIG. 7 illustrates the resultant structure following a planarization process.

FIG. 7 illustrates the resultant structure following a planarization process such as, for example, a chemical mechanical polishing (CMP) process that removes portions of the first and second dielectric material layers 602 and 604, the hardmask layers 110 and 116, and the spacers 404 and 406; to expose portions of the spacers 404 and 406 and the and the structures 114 and 108.

Figure 8:
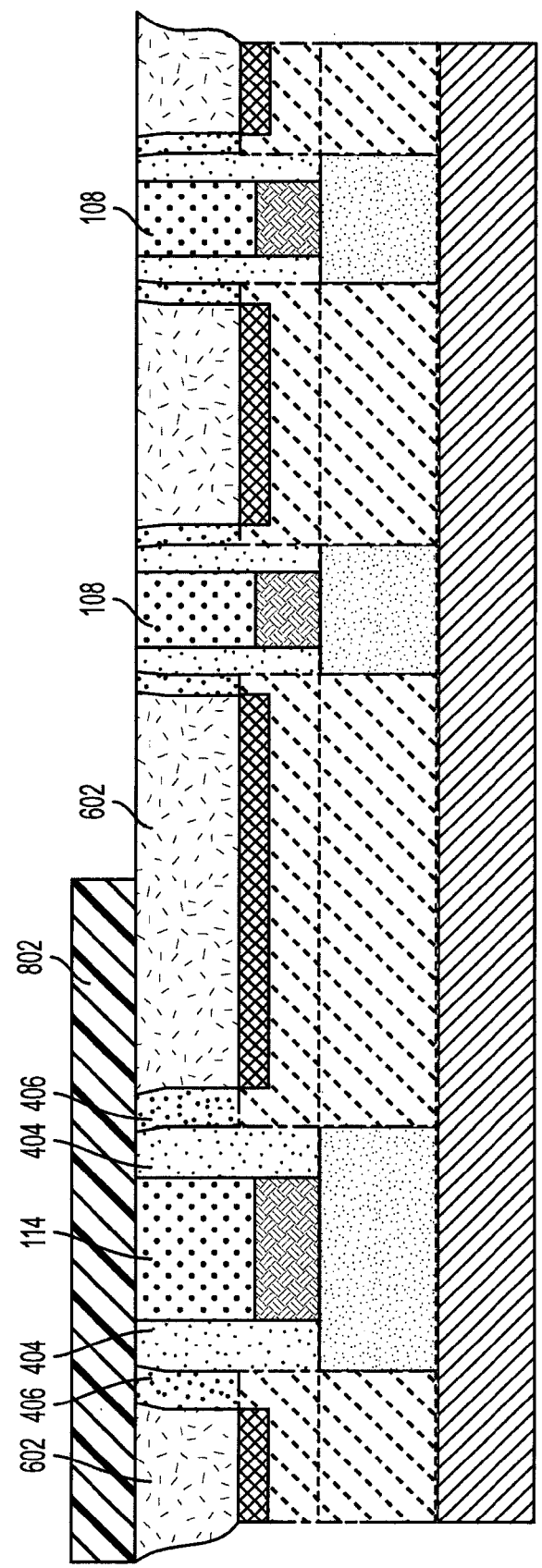
FIG. 8 illustrates the formation of a masking layer.

FIG. 8 illustrates the formation of a masking layer 802. The masking layer 802 may include, for example, an oxide or nitride material, and is formed by, for example a material deposition followed by a lithographic patterning and etching process that patterns the masking layer 802 over portions of the exposed portions of the first dielectric material layer 602 and the gate stack 114.

Figure 9:
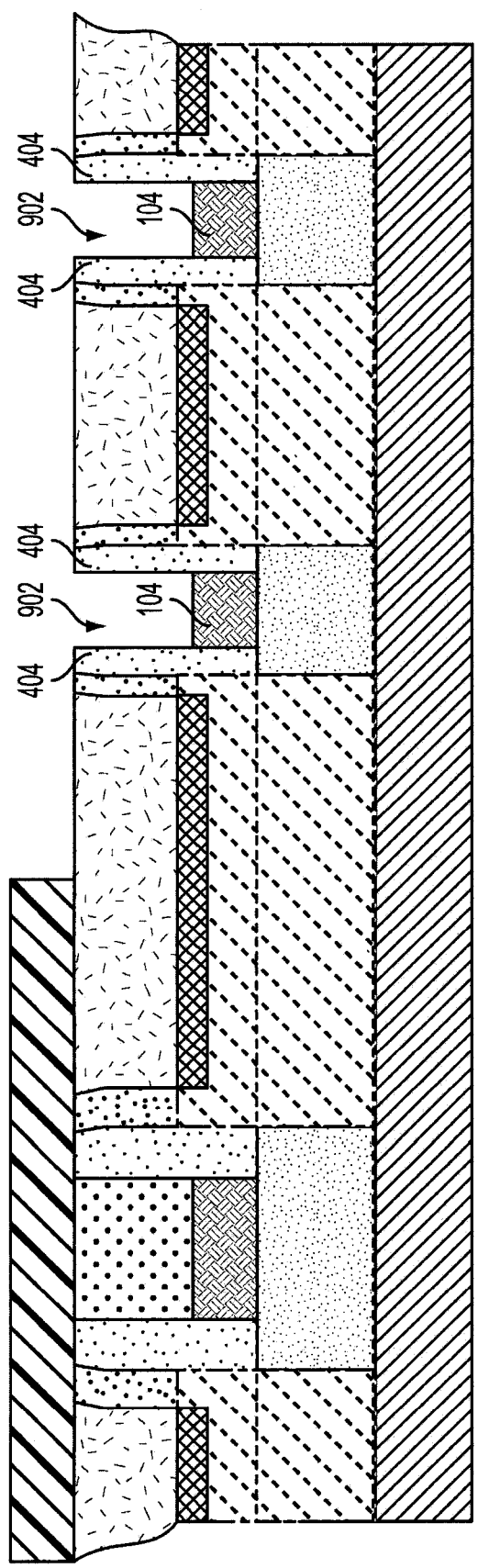
FIG. 9 illustrates the resultant structure following the removal of dummy gate structures.

FIG. 9 illustrates the resultant structure following the removal of the dummy gate structures 108 (of FIG. 8) that results in cavities 902 that are partially defined by the spacers 404. The dummy gate structures 108 may be removed by, for example, a wet etching (e.g., tetramethylammonium hydroxide (TMAH) or hot ammonia) or reactive ion etching (RIE) process. In an alternate exemplary embodiment, if a Tri-gate FET arrangement is desired, the exposed capping layer 104 may be removed following the removal of the dummy gate structures 108.

Figure 10:
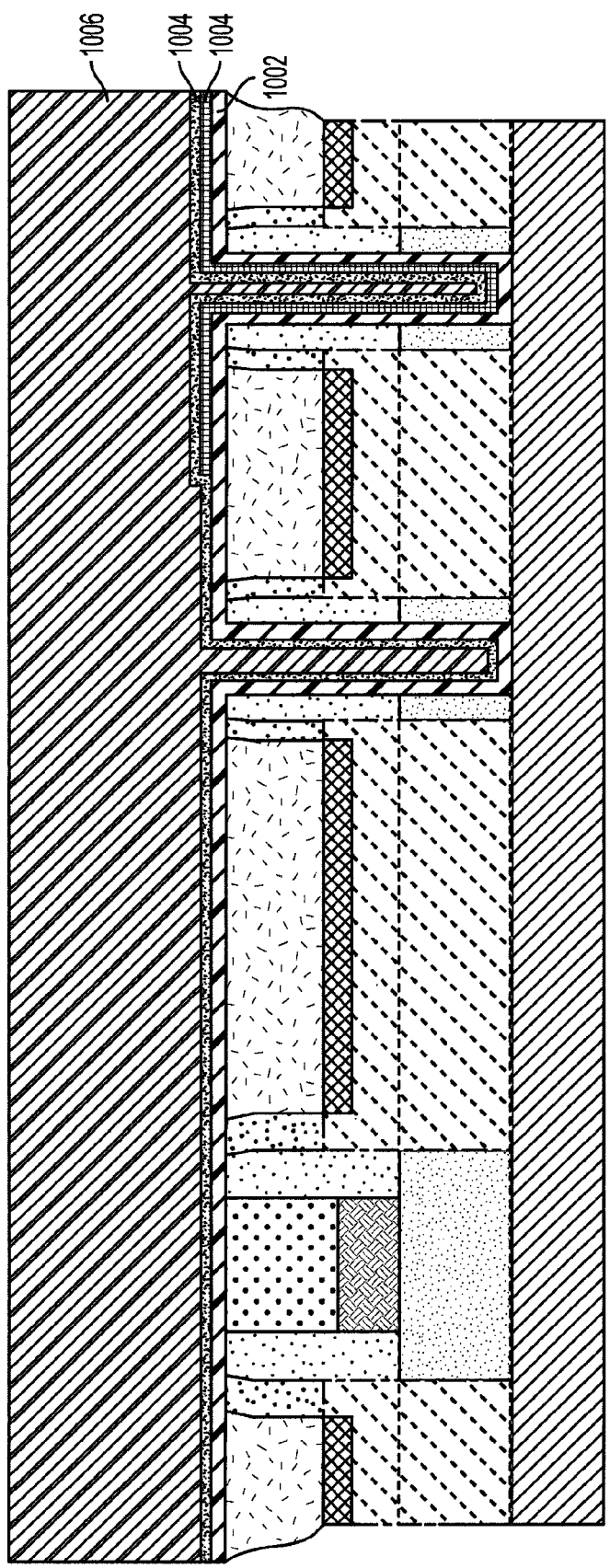
FIG. 10 illustrates the formation of nFET and pFET gate stacks.

FIG. 10 illustrates the formation of nFET and pFET gate stacks in the cavities 902 (of FIG. 9). In this regard, the masking layer 802 (of FIG. 9) is removed. A conformal layer of high K material 1002 such as for example, a hafnium based oxide material is deposited over exposed portions of the arrangement including the cavities 902. A metallic gate material 1004 is formed over the high K material layer 1002, and a layer of gate conductor material 1006 is formed over the metallic gate material 1004. The metallic gate material layer 1004 may include, for example one or more layers of gate metal material such as, for example, a metal gate material stack that includes one or more layers of metal materials such as, for example, Al, Ta, TaN, W, WN, Ti, TN, Ru and HfSi, having an appropriate work function depending on whether the device is an NFET or a PFET device. The gate conductor material 1006 may include, for example, aluminum, tungsten, or copper. The layers 1002, 1004 and 1006 may be formed by, for example a CVD or plasma enhanced chemical vapor deposition (PECVD) process.

Figure 11:
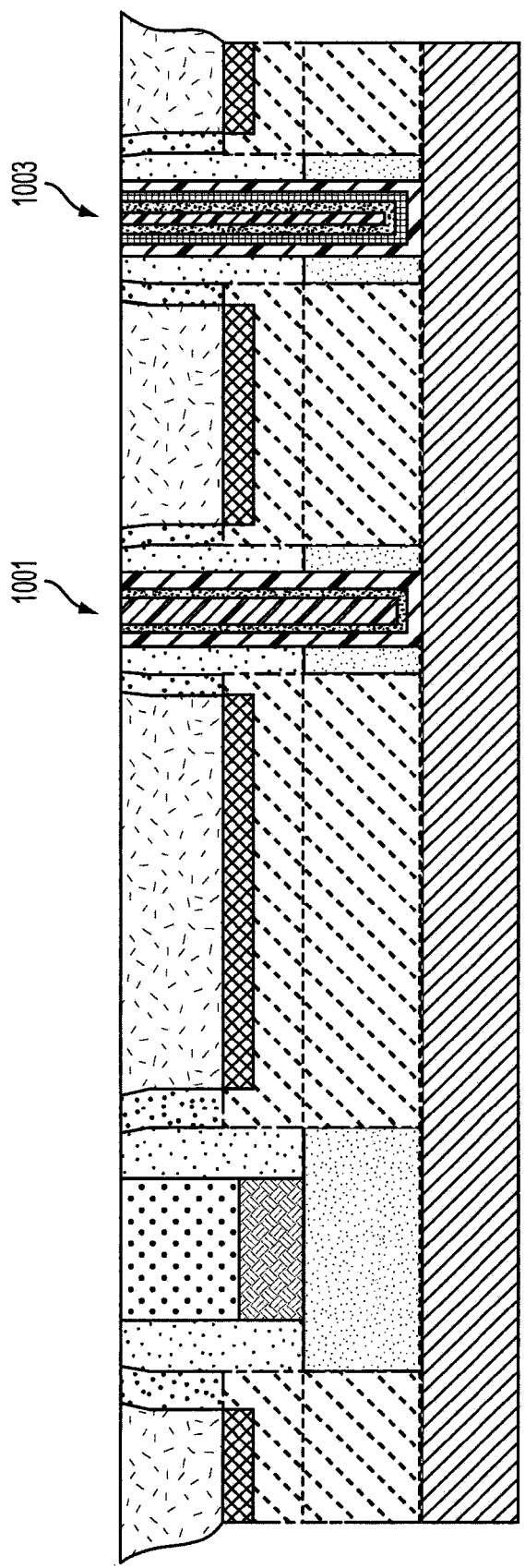
FIG. 11 illustrates the resultant structure following a planarization process.

FIG. 11 illustrates the resultant structure following a planarization process such as, for example a CMP process that removes portions of the layers 1002, 1004 and 1006 to define an nFET gate stack 1001 and a pFET gate stack 1003. The metallic gate material layer 1004 may include different materials in each device if desired to form an nFET gate stack 1001 and/or a pFET gate stack 1003. Though the illustrated embodiment includes an nFET gate stack 1001 and a pFET gate stack 1003, one of ordinary skill in the art would understand that any number or combination of arrangements of types of FET devices may be formed in a similar manner, and are not limited to the exemplary arrangement described herein.

Figure 12:
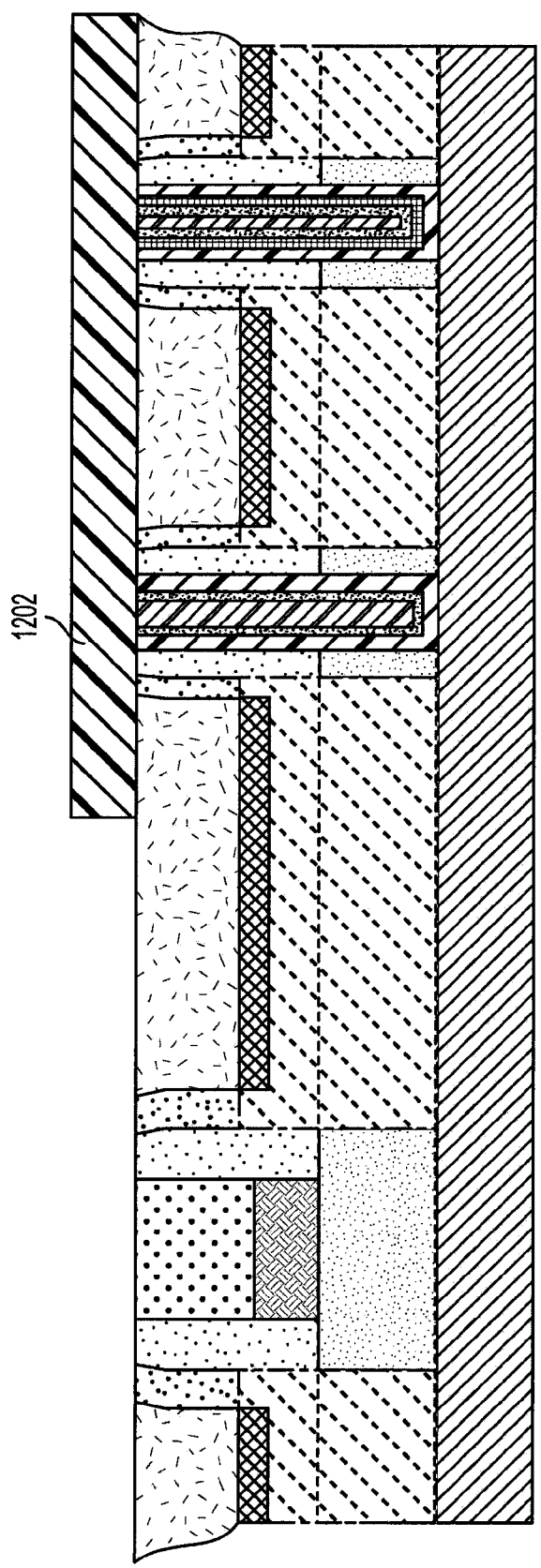
FIG. 12 illustrates the formation of a masking layer.

FIG. 12 illustrates the formation of a masking layer 1202. The masking layer 1202 may include, for example, an oxide or nitride material, and is formed by, for example a material deposition followed by a lithographic patterning and etching process that patterns the masking layer 1202 over portions of the exposed portions of the first dielectric material layer 602 and the nFET gate stack 1001 and a pFET gate stack 1003.

Figure 13:
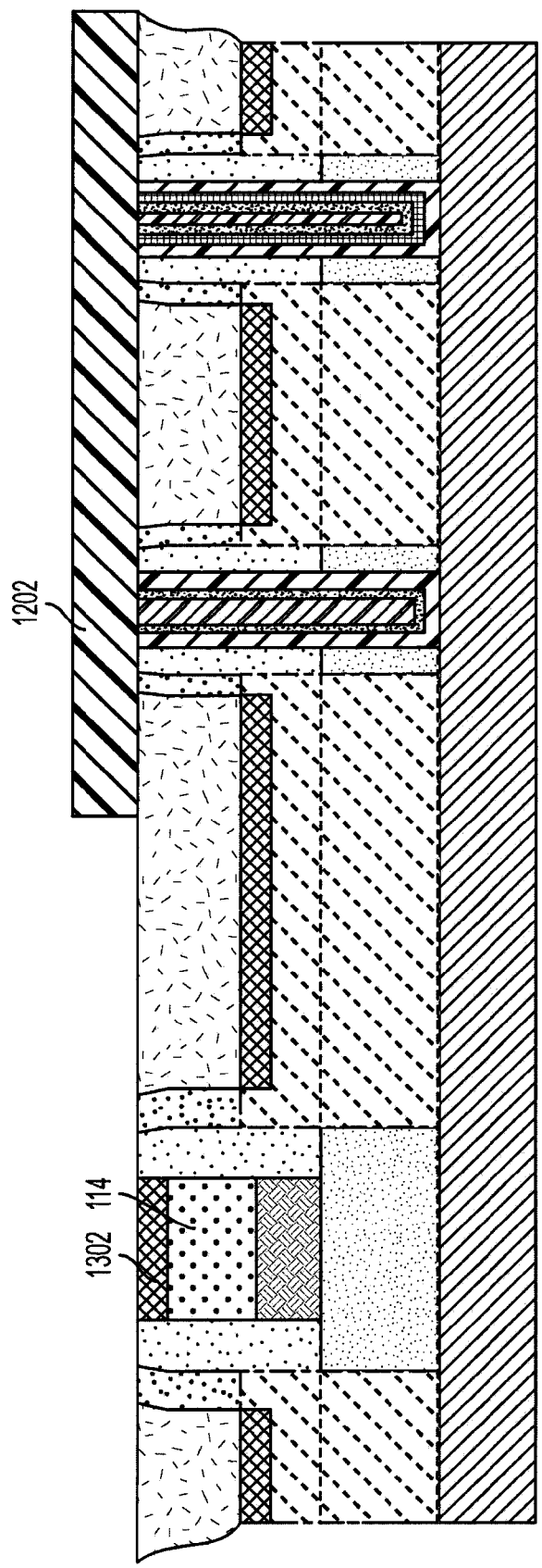
FIG. 13 illustrates the formation of a silicide material.

FIG. 13 illustrates the formation of a silicide material 1302 over exposed portions of the gate stack 114. In this regard, the gate stack 114 may have been formed (as shown in FIG. 1) from in-situ doped polysilicon material. Alternatively, the gate stack 114 may be, for example, doped using an ion implantation method following the formation of the masking layer 1202, and prior to the formation of the silicide material 1302. The silicide material 1302 may be formed using any suitable salicidation process.

Figure 14:
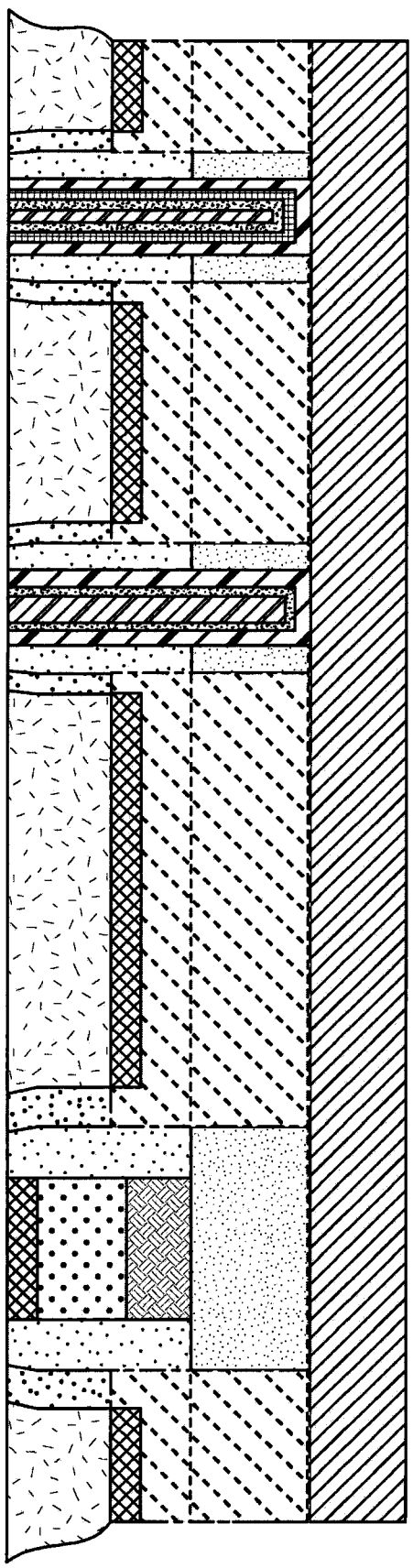
FIG. 14 illustrates the removal of the masking layer.

FIG. 14 illustrates the removal of the masking layer 1202 (of FIG. 13).

Figure 15:
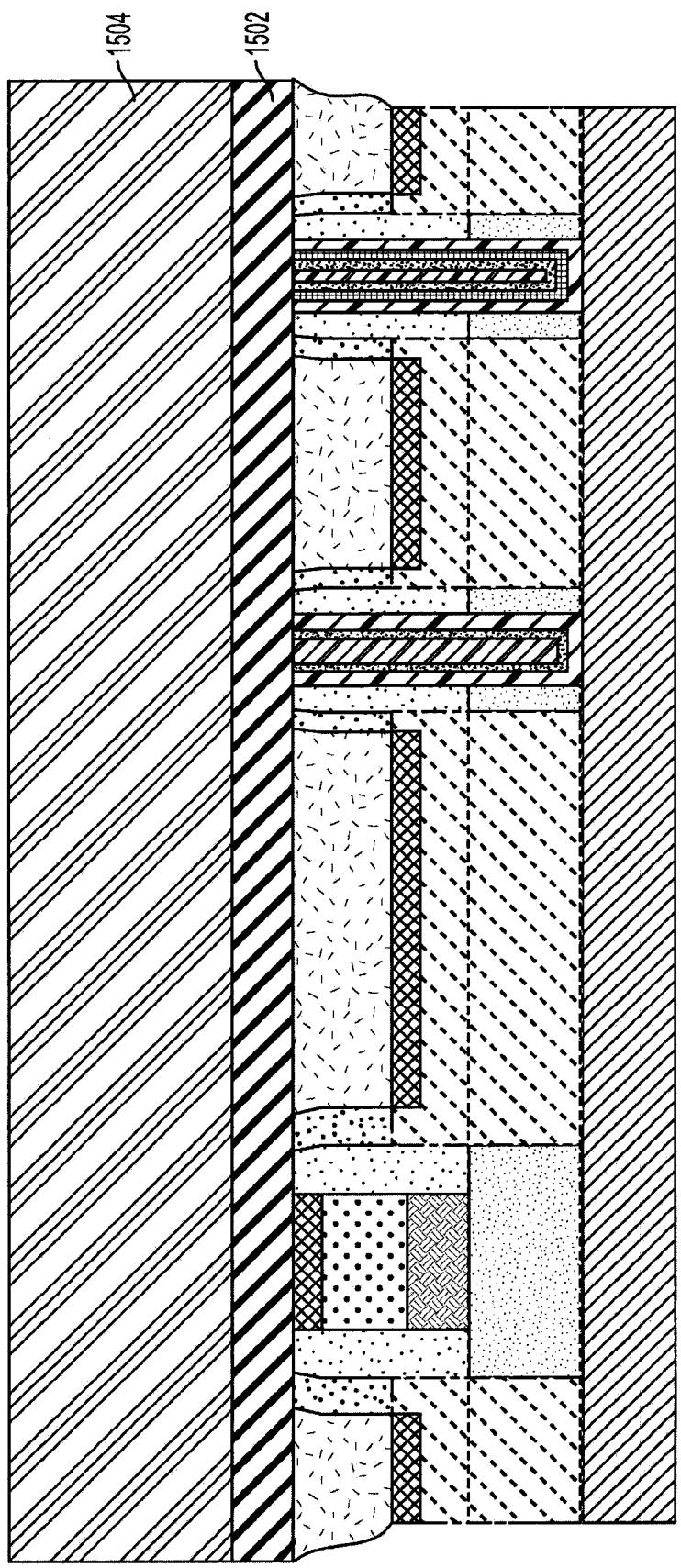
FIG. 15 illustrates the formation of capping layers.

FIG. 15 illustrates the formation of capping layers 1502 and 1504. The capping layer 1502 may include for example, a nitride material, and the capping layer 1504 may include, for example, an oxide material.

Figure 16:
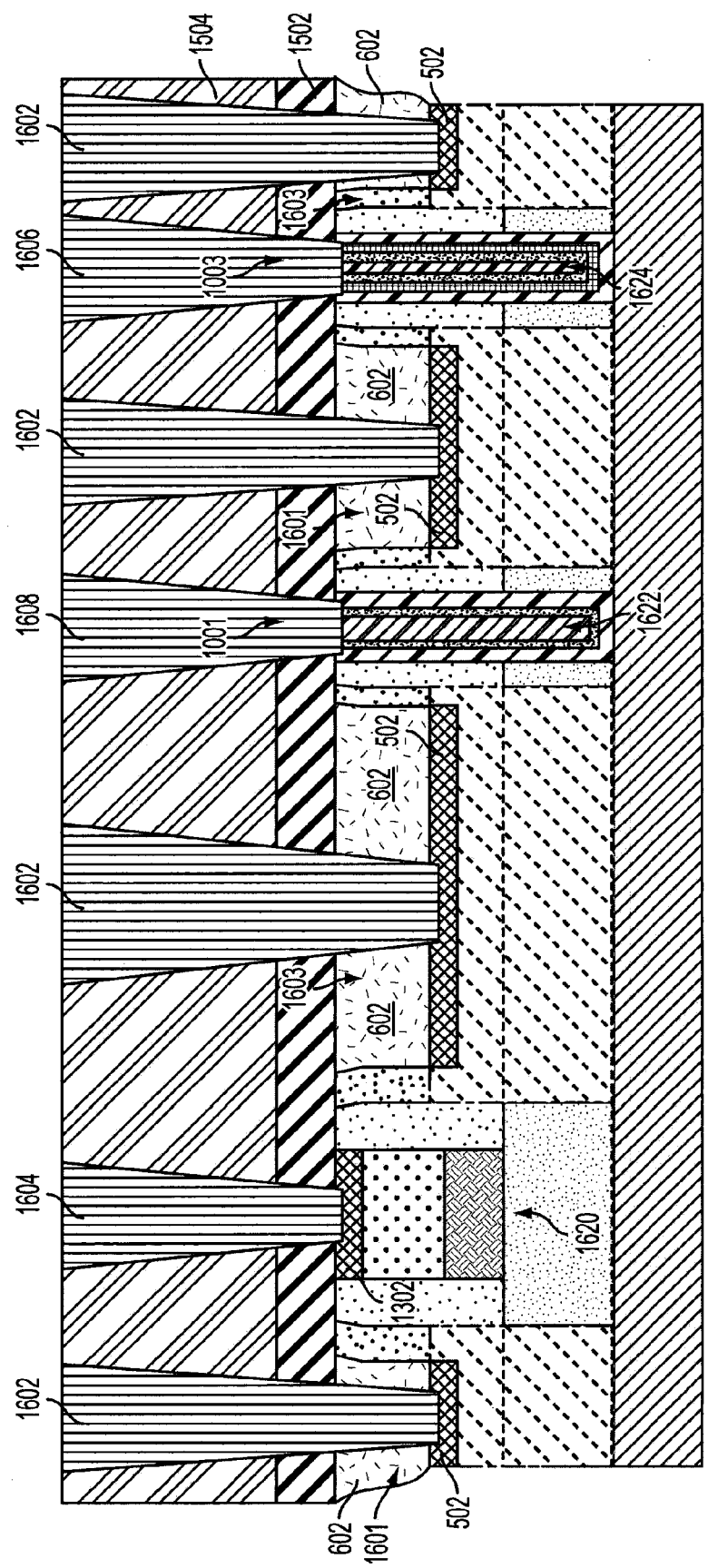
FIG. 16 illustrates the resultant structure following the formation of source, drain, and gate contacts.

FIG. 16 illustrates the resultant structure following the formation of source, drain, and gate contacts. In this regard, portions of the capping layers 1502 and 1504, and the dielectric material layer 602 are removed using, for example, a lithographic patterning and etching process that exposes portions of the silicide materials 502 and 1302 and the nFET gate stack 1001 and a pFET gate stack 1003. The vias are filled with a conductive material such as, for example, silver, aluminum, or gold, followed by a planarization process that defines conductive contacts 1602, 1604, 1606, and 1608. The conductive contacts 1602 are communicative with source regions 1601 and drain regions 1603. The conductive contact 1604 is communicative with the gate stack 114 of the thick gate-dielectric material FET device 1620. The conductive via 1608 is communicative with the nFET gate stack 1001 of the thin gate-dielectric material FET device 1622, and the conductive via 1606 is communicative with the pFET gate stack 1003 of the thin gate-dielectric material FET device 1624.

Figure 17:
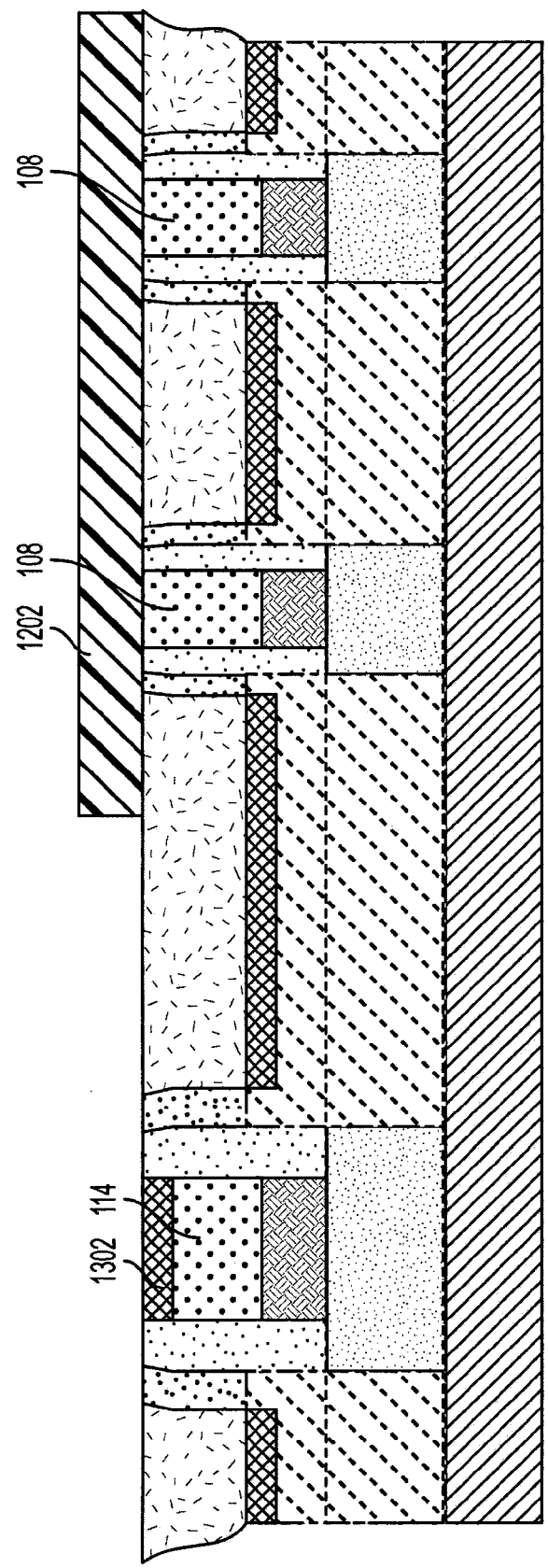
FIGS. 17-20 illustrate an alternate exemplary method for fabricating FET devices. In this regard.

FIGS. 17-20 illustrate an alternate exemplary method for fabricating FET devices. FIG. 17 illustrates the resultant structure following the procedures described above in FIGS. 1-13. In this regard, a silicide material 1302 has been formed on the gate stack 114.

Figure 18:
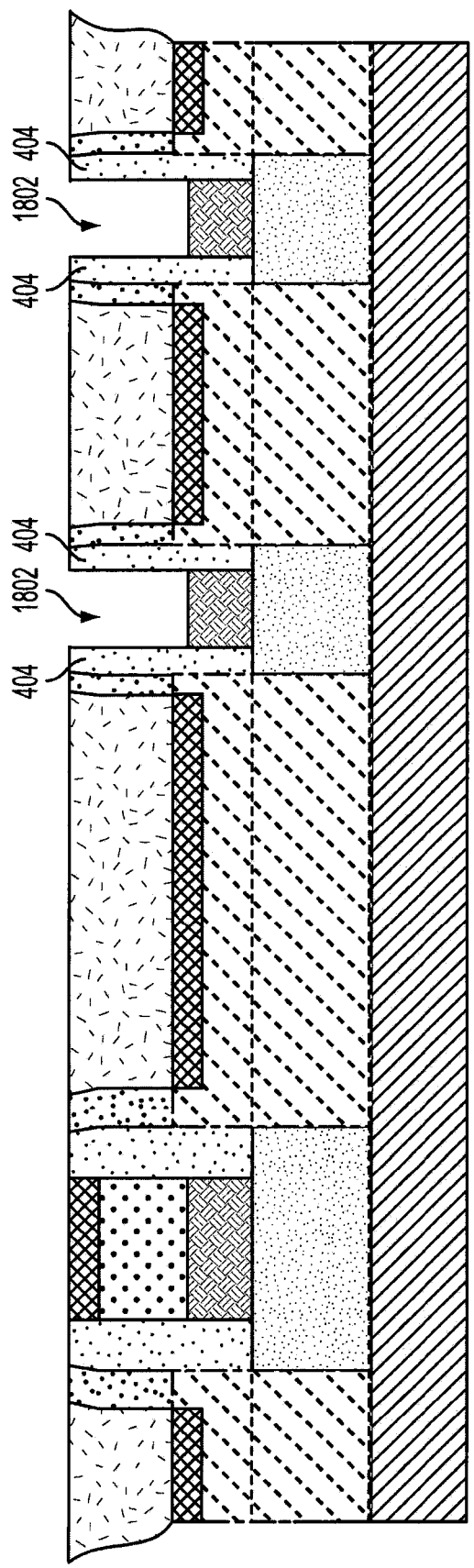

Referring to FIG. 18, the masking layer 1202 (of FIG. 17) has been removed. Following the removal of the masking layer 1202, the dummy gate structures 108 (of FIG. 17) are removed resulting in cavities 1802 that are partially defined by the spacers 404. The dummy gate structures 108 may be removed by, for example, a wet etching (e.g., tetramethylammonium hydroxide (TMAH) or hot ammonia) or reactive ion etching (RIE) process. In an alternate exemplary embodiment, if a Tri-gate FET arrangement is desired, the exposed capping layer 104 may be removed following the removal of the dummy gate structures 108.

Figure 19:
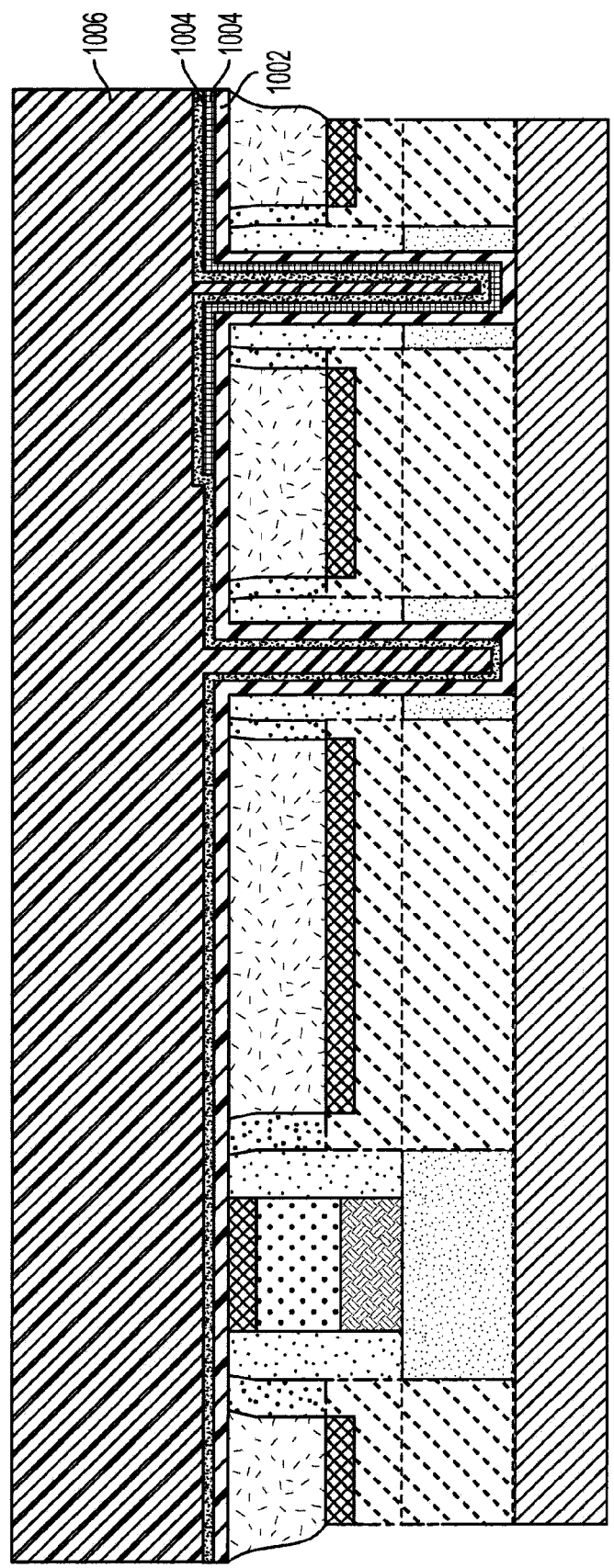

FIG. 19 illustrates the formation of nFET and pFET gate stacks in the cavities 1802 (of FIG. 18). A conformal layer of high K material 1002 such as for example, a hafnium based oxide material is deposited over exposed portions of the arrangement including the cavities 1802. A metallic gate material 1004 is formed over the high K material layer 1002, and a layer of gate conductor material 1006 is formed over the metallic gate material 1004. The metallic gate material layer 1004 may include, for example one or more layers of gate metal material such as, for example, Al, Ta, TaN, W, WN, Ti, TiN, Ru and HfSi, having an appropriate work function depending on whether the device is an NFET or a PFET device. The gate conductor material 1006 may include, for example, aluminum, tungsten, or copper. The layers 1002, 1004 and 1006 may be formed by, for example a CVD or plasma enhanced chemical vapor deposition (PECVD) process.

Figure 20:
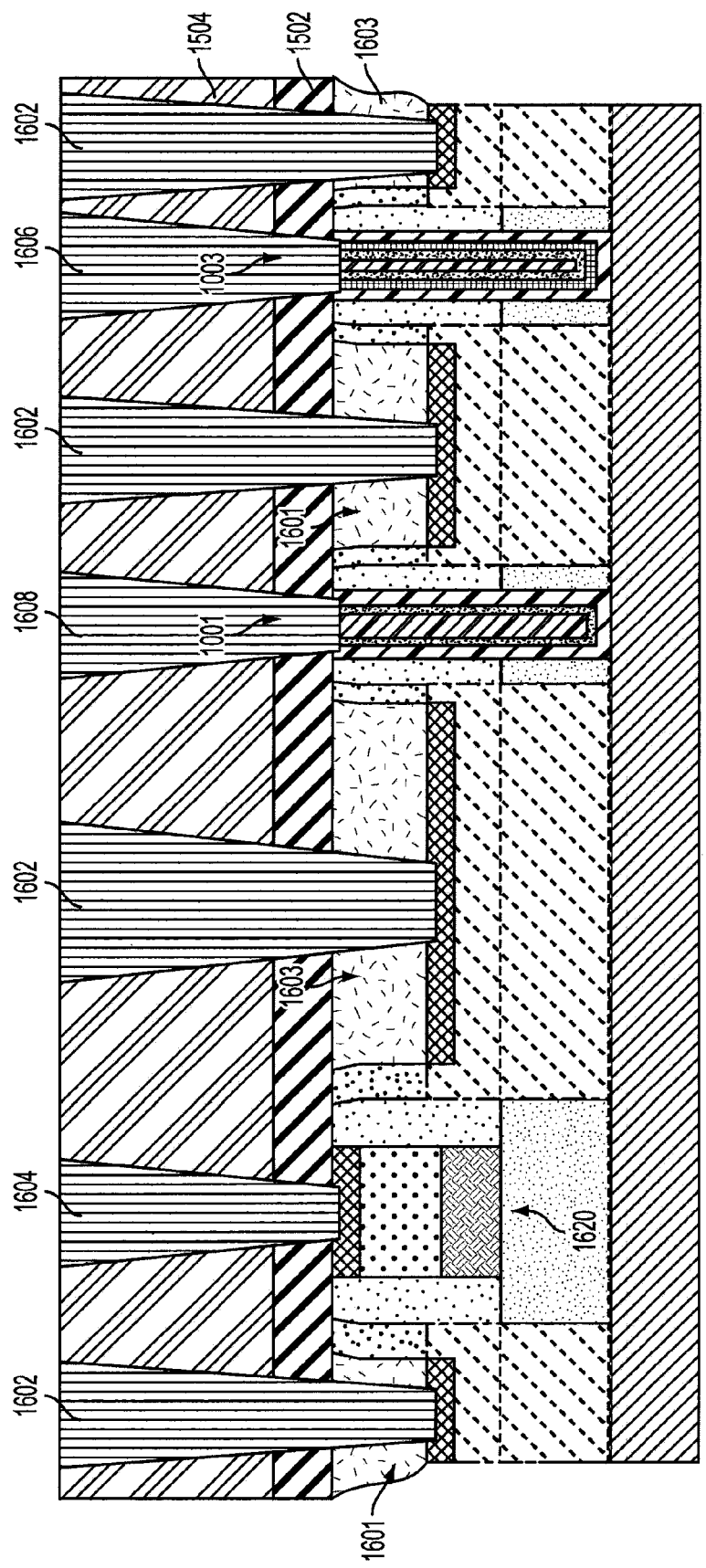

FIG. 20 illustrates the resultant structure following a planarization process similar to the process shown in FIG. 11 that defines an nFET gate stack 1001 and a pFET gate stack 1003. Following the planarization process, capping layers 1502 and 1504 are formed in a similar manner as shown in FIG. 15, and conductive contacts 1602, 1604, 1606, and 1608 are formed in a similar manner as shown in FIG. 16 that are communicative with the source regions 1601 and drain regions 1603 of the nFET gate stack 1001, pFET gate stack 1003, and gate stack 114 of the thick gate-dielectric material FET device 1620.

Figure 21:
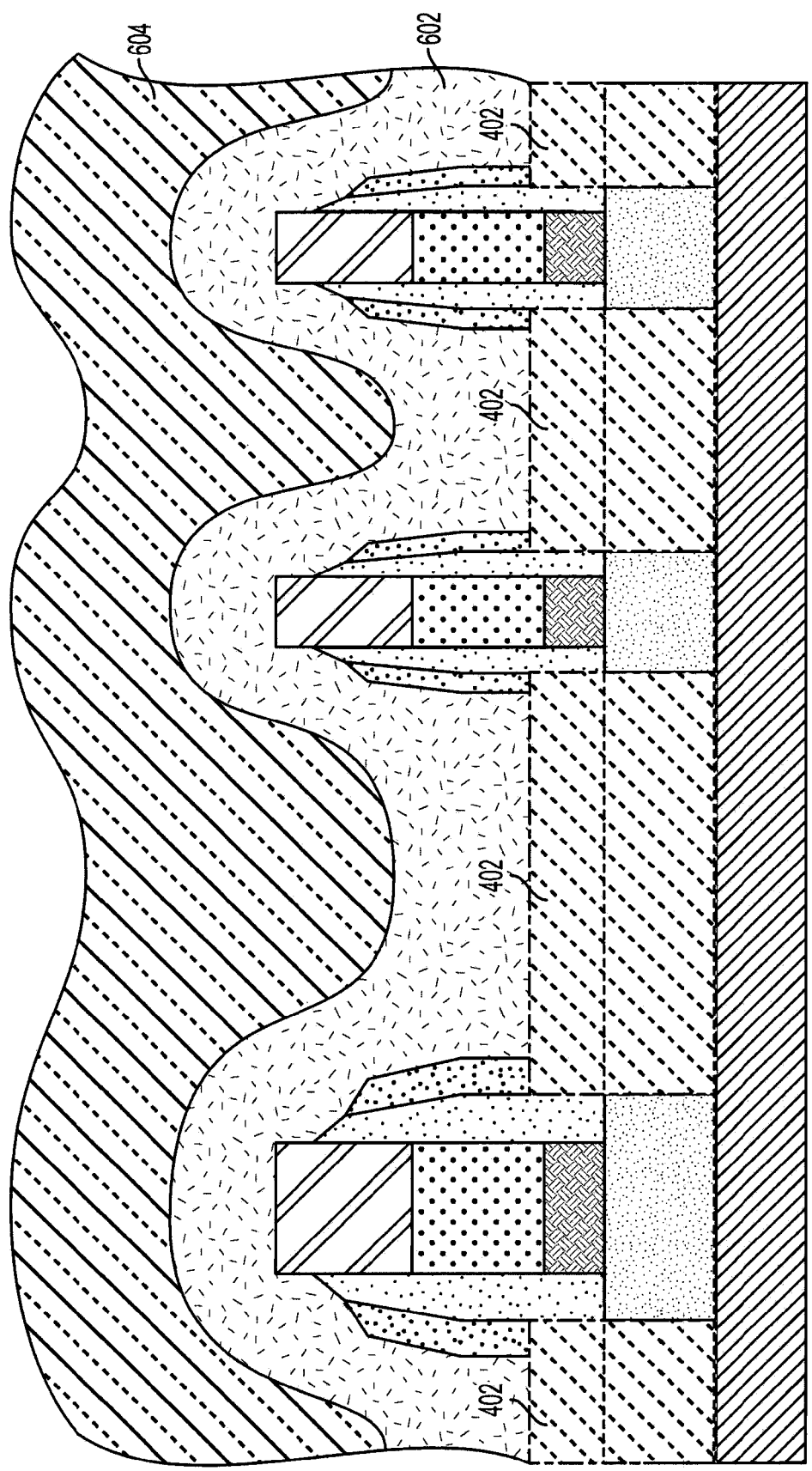
FIGS. 21-27 illustrate another alternate exemplary method for fabricating FET devices. In this regard.

FIGS. 21-27 illustrate an alternate exemplary method for fabricating FET devices. FIG. 21 illustrates the resultant structure following the procedures described above in FIGS. 1-4 and 6. In this regard, a silicide material (e.g., silicide material 502 of FIG. 5) has not been formed in exposed portions of the regions 402, and a first dielectric material layer 602 has been formed over exposed portions of the regions 402, the spacers 404 and 406, the hardmask layers 110 and 116, and the substrate 100. Following the formation of the first dielectric material layer 602, a second dielectric material layer 604 may be formed over the first dielectric material layer 602.

Figure 22:
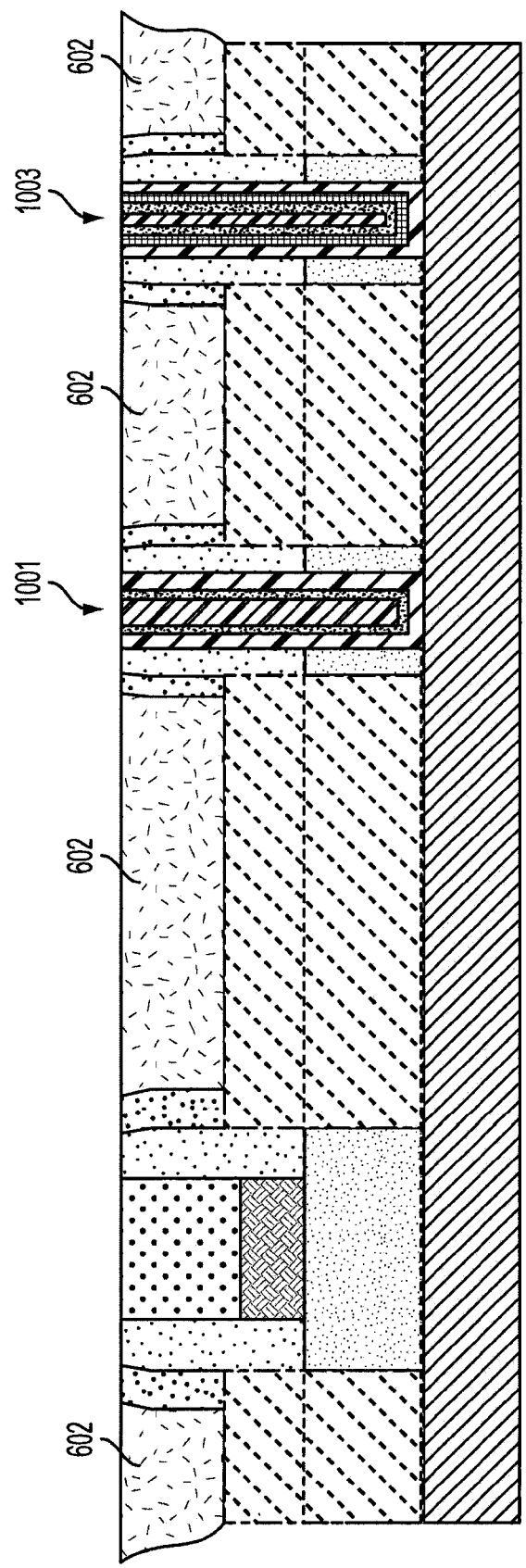

FIG. 22 illustrates the resultant structure following processes similar to the processes described above in FIGS. 7-11 resulting in the definition of an nFET gate stack 1001 and a pFET gate stack 1003.

Figure 23:
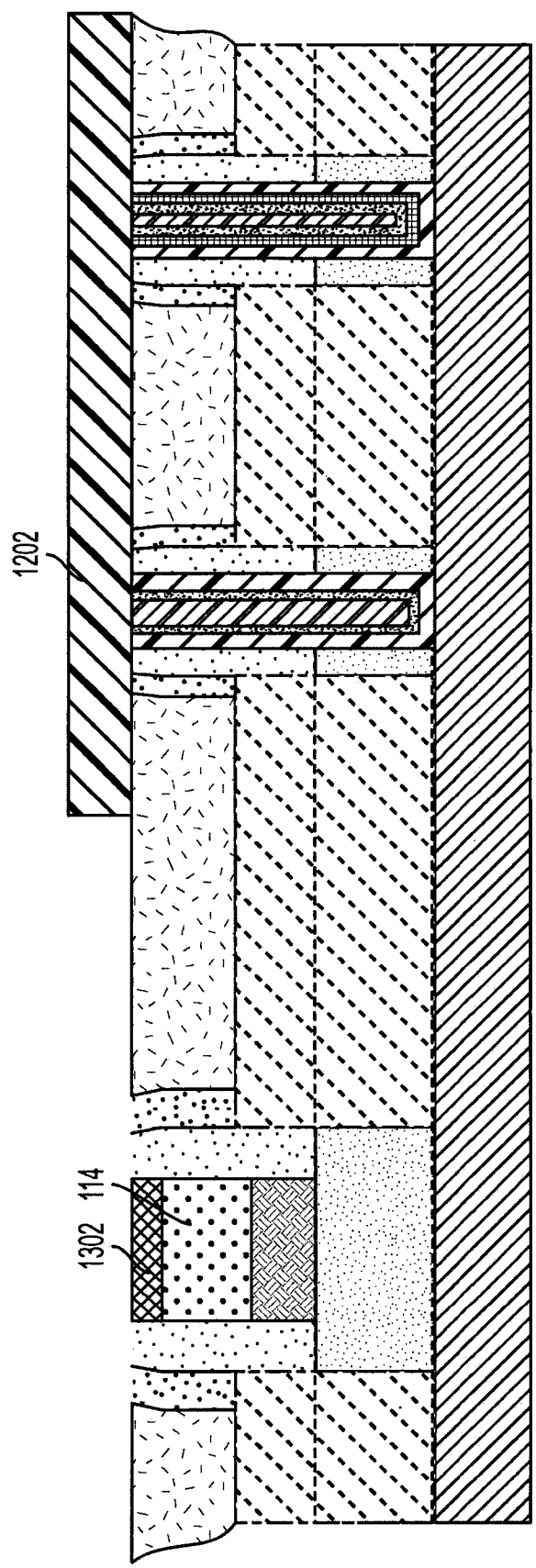

FIG. 23 illustrates the formation of a masking layer 1202 followed by the formation of a silicide material 1302 over exposed portions of the gate stack 114 in a similar manner as discussed above in FIGS. 12-13.

Figure 24:
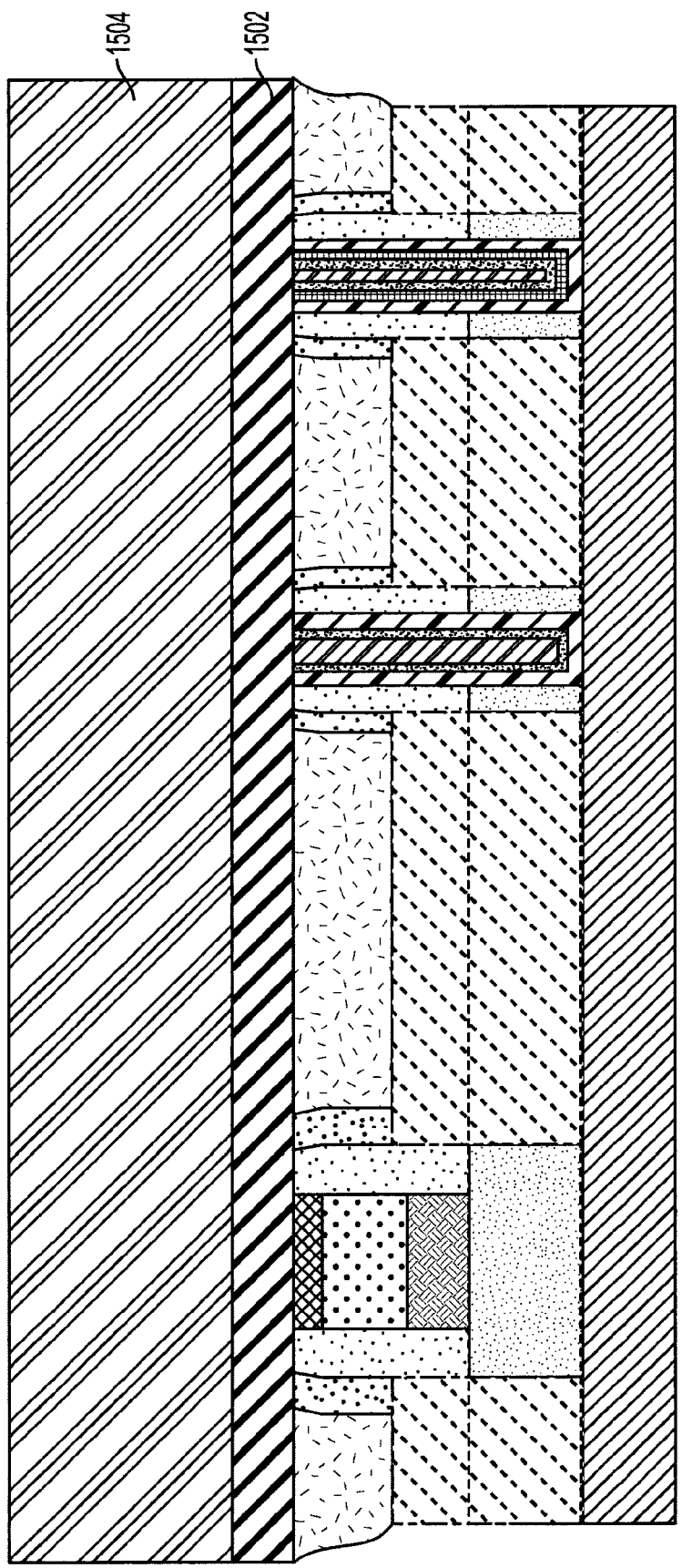

FIG. 24 illustrates the formation of capping layers 1502 and 1504 that are formed in a similar manner as shown in FIG. 15.

Figure 25:
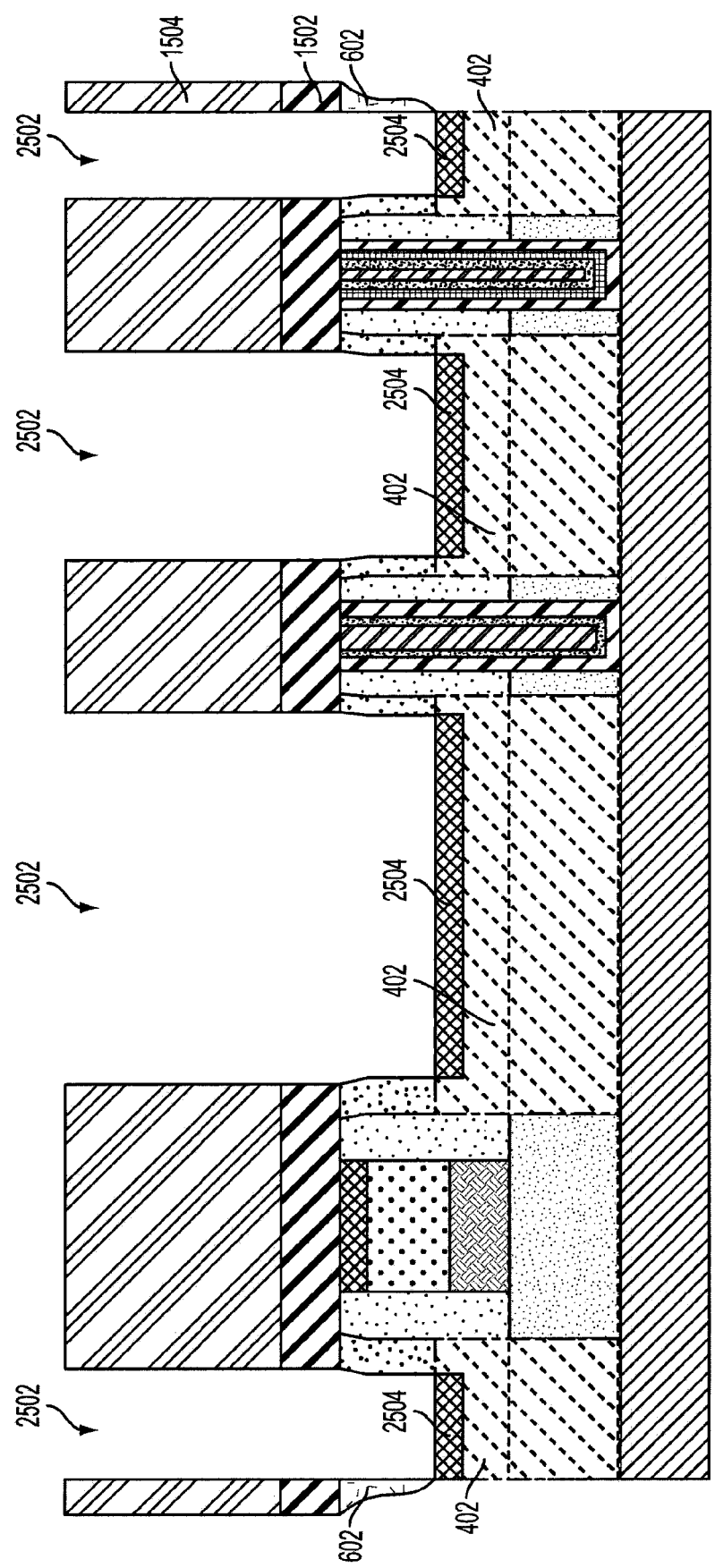

FIG. 25 illustrates the removal of portions of the capping layers 1502 and 1504, and the first dielectric material layer 602 that forms cavities 2502 that expose portions of the regions 402. Following the formation of cavities 2502, a silicide material 2504 is formed on exposed portions of the regions 402 using similar salicidation methods as described above. The cavities 2502 are partially defined by the silicide material 2504, and the capping layers 1502 and 1504.

Figure 26:
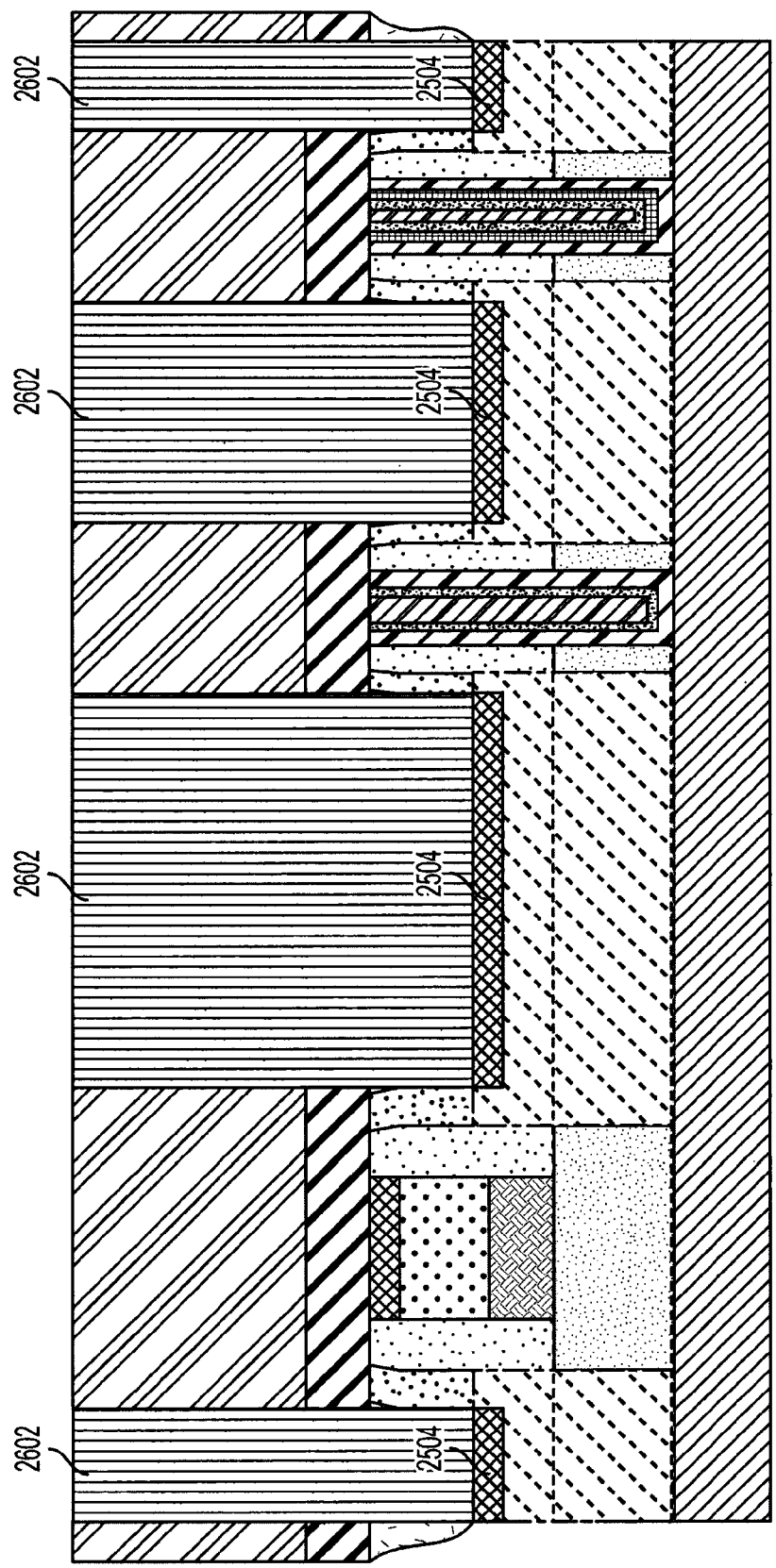

FIG. 26 illustrates the formation of conductive contacts 2602 that fill the cavities 2502 (of FIG. 25). The conductive contacts 2602 may be formed from any suitable conductive metal and are formed by, for example, a CVD or PECVD deposition process followed by a planarization process, such as, for example CMP.

Figure 27:
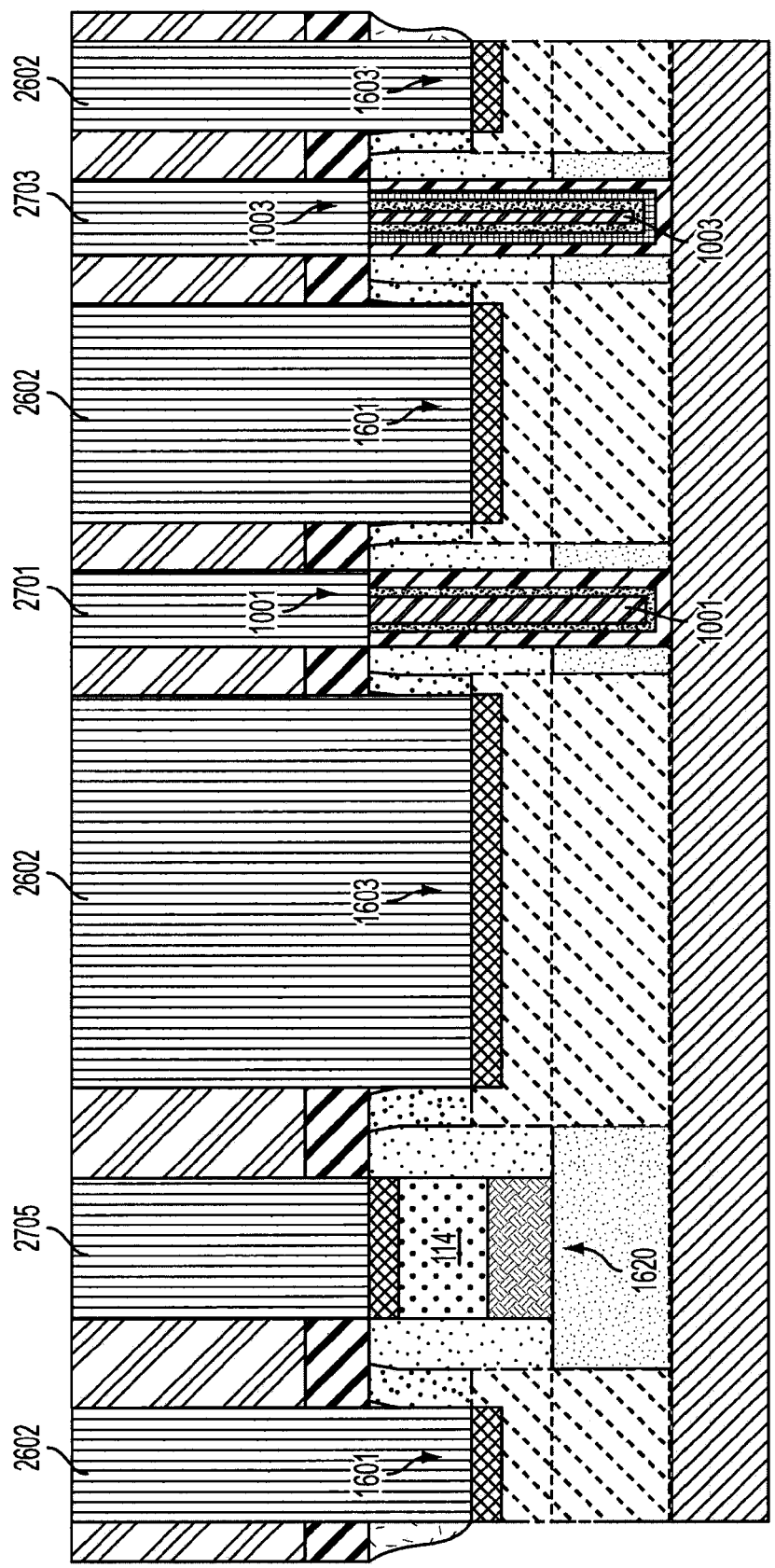

FIG. 27 illustrates the resultant structure following the formation of conductive contacts 2701, 2703, and 2705 that are communicative with the source regions 1601 and drain regions 1603 of the nFET gate stack 1001, pFET gate stack 1003, and gate stack 114 of the thick gate-dielectric material FET device 1620.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for fabricating a semiconductor device, the method comprising:
   forming a fin on a substrate;
   forming a first gate stack over a first portion of the fin;
   forming a dummy gate stack over a second portion of the fin;
   growing an epitaxial material from exposed portions of the fin to define source and drain regions;
   forming a silicide material on exposed portions of the epitaxial material;
   forming a layer of dielectric material over the silicide material, the first gate stack, and the dummy gate stack;
   performing a planarizing process that removes portions of the layer of dielectric material, the first gate stack, and the dummy gate stack;
   pattering a first mask over portions of the layer of dielectric material and the first gate stack;
   removing a polysilicon portion of the dummy gate stack to define a cavity;
   removing the first mask;
   forming a second gate stack in the cavity;
   forming a second mask over portions of the layer of dielectric material and the second gate stack; and
   forming a silicide material on exposed portions of the first gate stack.

2. The method of claim 1, further comprising removing the second mask.

3. The method of claim 2, further comprising forming a capping material over the layer of dielectric material, the first gate stack, and the second gate stack.

4. The method of claim 3, further comprising forming conductive vias communicative with the source and drain regions and conductive vias communicative with the first gate stack and the second gate stack.

5. The method of claim 1, further comprising forming a first set of spacers adjacent to opposing sides of the first gate stack and adjacent to opposing sides of the second gate stack prior to growing the epitaxial material.

6. The method of claim 5, further comprising forming a second set of spacers adjacent to the first set of spacers prior to forming the silicide material on the exposed portions of the epitaxial material.

7. The method of claim 1, wherein the second gate stack is formed by:
   depositing a layer of metal gate material in the cavity; and
   depositing a layer of gate conductor material over the layer of metal gate material.

8. The method of claim 3, wherein the capping material includes a layer of nitride material and a layer of oxide material disposed on the layer of nitride material.

9. A method for fabricating a semiconductor device, the method comprising:
   forming a fin on a substrate;
   forming a first gate stack over a portion of the fin;
   forming a dummy gate stack over a portion of the fin;
   growing an epitaxial material from exposed portions of the fin to define source and drain regions;
   forming a silicide material on exposed portions of the epitaxial material;
   forming a layer of dielectric material over the silicide material, the first gate stack, and the dummy gate stack;
   performing a planarizing process that removes portions of the layer of dielectric material, the first gate stack, and the dummy gate stack;
   pattering a first mask over portions of the layer of dielectric material and the dummy gate stack;

forming a silicide material on exposed portions of the first gate stack;
removing the first mask;
pattering a second mask over portions of the layer of dielectric material and the first gate stack;
removing a polysilicon portion of the dummy gate stack to define a cavity;
removing the second mask; and
forming a second gate stack in the cavity.

10. The method of claim 9, further comprising removing the second mask.

11. The method of claim 10, further comprising forming a capping material over the layer of dielectric material, the first gate stack, and the second gate stack.

12. The method of claim 11, further comprising forming conductive vias communicative with the source and drain regions and conductive vias communicative with the first gate stack and the second gate stack.

13. The method of claim 9, further comprising forming a first set of spacers adjacent to opposing sides of the first gate stack and adjacent to opposing sides of the second gate stack prior to growing the epitaxial material.

14. The method of claim 13, further comprising forming a second set of spacers adjacent to the first set of spacers prior to forming the silicide material on the exposed portions of the epitaxial material.

15. The method of claim 9, wherein the second gate stack is formed by:
depositing a layer of metal gate material in the cavity; and
depositing a layer of gate conductor material over the layer of metal gate material.

16. The method of claim 11, wherein the capping material includes a layer of nitride material and a layer of oxide material disposed on the layer of nitride material.

17. A method for fabricating a semiconductor device, the method comprising:
forming a fin on a substrate;
forming a first gate stack over a portion of the fin;
forming a dummy gate stack over a portion of the fin;
growing an epitaxial material from exposed portions of the fin to define source and drain regions;
forming a layer of dielectric material over the epitaxial material, the first gate stack, and the dummy gate stack;
performing a planarizing process that removes portions of the layer of dielectric material, the first gate stack, and the dummy gate stack;
pattering a first mask over portions of the layer of dielectric material and the dummy gate stack;
forming a silicide material on exposed portions of the first gate stack;
removing the first mask;
pattering a second mask over portions of the layer of dielectric material and the first gate stack;
removing a polysilicon portion of the dummy gate stack to define a cavity;
removing the second mask; and
forming a second gate stack in the cavity.

18. The method of claim 9, further comprising removing the second mask, and forming a capping material over the layer of dielectric material, the first gate stack, and the second gate stack.

19. The method of claim 18, further comprising:
removing portions of the capping material to expose portions of the epitaxial material; and
forming a silicide material on exposed portions of the epitaxial material.

20. The method of claim 11, further comprising forming conductive material over exposed portions of the silicide material.

* * * * *